United States Patent [19]

Imamura

[11] Patent Number: 5,443,942
[45] Date of Patent: Aug. 22, 1995

[54] PROCESS FOR REMOVING RESIST

[75] Inventor: Isao Imamura, Yokohama, Japan

[73] Assignee: Canon Kabushiki Kaisha, Tokyo, Japan

[21] Appl. No.: 910,286

[22] PCT Filed: Nov. 28, 1990

[86] PCT No.: PCT/JP91/01635
§ 371 Date: Jul. 17, 1992
§ 102(e) Date: Jul. 17, 1992

[87] PCT Pub. No.: WO92/09935
PCT Pub. Date: Jun. 11, 1992

[30] Foreign Application Priority Data

Nov. 28, 1990 [JP] Japan .................................. 2-322451
Nov. 28, 1990 [JP] Japan .................................. 2-322452

[51] Int. Cl.⁶ .............................................. G03C 5/00
[52] U.S. Cl. .................................. 430/329; 430/311; 430/312; 430/313; 430/314
[58] Field of Search ............... 430/329, 311, 312, 313, 430/314; 134/1, 50

[56] References Cited

FOREIGN PATENT DOCUMENTS 53-76754  7/1978  Japan .
57-62530  4/1982  Japan .
58-143534 8/1983  Japan .
59-143327 8/1984  Japan .
63-58831  3/1988  Japan .

Primary Examiner—Charles L. Bowers, Jr.
Assistant Examiner—Geraldine Letscher
Attorney, Agent, or Firm—Fitzpatrick, Cella, Harper & Scinto

[57] ABSTRACT

A resist removing process and an apparatus therefor which markedly improve the resist removing efficiency by a resist removing liquid by jetting the resist removing liquid and a gas to the resist while mixing them or by alternately jetting the resist removing liquid and the gas to the resist, wherein uniformity relative to removal of the resist by the resist removing liquid is secured at an extremely high level.

27 Claims, 7 Drawing Sheets

PROCESS FOR REMOVING RESIST

FIELD OF THE INVENTION

The present invention relates to a process and an apparatus for removing a resist which are applicable in microprocessing methods representatively such as photolithography. The process and the apparatus of the present invention for removing a resist are effective particularly in the production of an ink jet recording head.

BACKGROUND OF THE INVENTION

In the microprocessing methods such as photolithography and the like, a resist is used comprising photosensitive resin or the like in order to form a minute pattern. (Said resist is often called "photoresist" since it has a photosensitivity, but it will be hereinafter referred to as "resist".)

For instance, in the case of producing a semiconductor element, a resist is applied onto a base member such as wafer, and after being subjected to light exposure, a soluble portion of the resist is removed in the development step or the successive removing step.

As the resist removing methods in the prior art, there are a spraying method wherein a resist removing liquid (which is usually called "developing solution" or "removing solution" in the field of photolithography, but in the following, it will be collectively referred to as "removing liquid") is sprayed to a resist on the base member to thereby remove the resist from the base member, and a dipping method wherein the base member having a resist disposed thereon is dipped into a removing liquid to thereby remove the resist on the base member. When required, a treatment for promoting the removal of the resist such as ultrasonic vibration treatment, heating treatment, stirring treatment, pressure circulating treatment, or the like is performed for the removing liquid. After the removal of the resist having been accomplished in this way, the base member is usually washed with the use of a rinsing liquid, followed by subjecting the washed base member to drying.

As for these conventional resist removing methods, there are such problems as will be described below.

That is, usually, finer the pattern formed, the greater the period of time for removing the resist is prolonged. However, when a removing liquid having a high resist solubility is used in order to shorten this period of time, other portion of the resist than the portion thereof to be removed is often swelled to cause a bridge, meander, mutual leaning or trailing between the adjacent resist patterns. In the worst case, said other portion of the resist than the portion thereof to be removed is dissolved, wherein the resulting pattern becomes narrowed in width. Thus, it is difficult to obtain a highly precise resist pattern of a desired size and shape in any case.

On the other hand, in the case where removal of the resist is carried out over a relatively long period of time using a removing liquid which is not so high in solubility, without concern about shortening of the removing period of time, it is possible to form a minute pattern with a satisfactory precision. However in reverse, a considerably large amount of the removing liquid is required in this case. In addition, problems are occasionally caused relative to defective removal that residues of the resist occur particularly at the fine portions, and insufficient removal that the resist portions, which were once removed, are returned to adhere, resulting in negative influences to the successive steps. These problems are hardly resolved in the prior art even by employing the foregoing treatments for promoting the removal of the resist.

Now, as one of the principal and effective methods for producing an ink jet recording head, there is a method in which removal of the resist is performed, which is described in U.S. Pat. Nos. 4,657,631 or 4,775,445 and which is schematically shown in FIG. 4(A) through FIG. 4(F). This method will be later detailed. In this method, on a base member 40 shown in FIG. 4(A) having an energy generating body 41 capable of generating an energy to be utilized for discharging ink disposed thereon is disposed a layer 42 comprising, for example, a positive type photosensitive resin as shown in FIG. 4(B). Then, the photosensitive resin layer 42 is subjected to patterning exposure to form a latent image 43a shown in FIG. 4(C), which is corresponding to ink pathway, on the photosensitive resin layer 42. Thereafter, the photosensitive resin layer 42 is subjected to development, to thereby pattern the photosensitive resin layer 42 as shown in FIG. 4(D). Successively, a material 44 capable of forming a wall for ink pathway is applied to cover the patterned photosensitive resin layer 43 as shown in FIG. 4(E). Then, after the patterned photosensitive resin layer 43 being subjected to exposure, the photosensitive resin layer is removed to form ink pathways 46 as shown in FIG. 4(F). Simultaneously with this step or after this step, a throughhole 45 for supplying ink to the ink pathways 46 is formed. Numeral reference 46a denotes a discharging outlet, through which ink is to be discharged, in communication with the ink pathways 46.

According to the method briefly explained above, there can be produced an ink jet recording head of a relatively high reliability. An ink jet recording device provided with such ink jet recording head is commercially available.

Even for such ink jet recording device, there is a social demand for further improving not only the recording speed but also the quality of an image recorded. As one of ideal ink jet recording heads capable of satisfying such social demand, there can be mentioned an ink jet recording head which is basically provided with numerous ink discharging outlets as many as possible being arranged at a high density.

However, in order to realize such an ink jet recording head provided with numerous discharging outlets at a high density, a matter as will be described in the following is spotlighted as the subject to be solved. That is, there is a tendency that as numerous discharging outlets are arranged at a higher density, the ink discharging characteristics of the discharging outlets as a whole are reduced, possibly due to the step of removing the resist at the time of producing the ink jet recording head.

The above matter is not serious and can be more or less accepted in the case of a head provided with a relatively small number of discharging outlets being arranged at a relatively low density. However, the above matter is a subject which cannot be slighted in the case where numerous discharging outlets are arranged at a high density. Particularly, it is a serious technical subject in the case of a so-called full-line type ink jet recording head which is provided with numerous, for instance, some thousands discharging outlets being arranged at a high density along the entire width of the recording area of a member on which an image is to be recorded, in which numerous electrothermal converting bodies are arranged at a high density on a base member such that they correspond to said numerous discharging outlets. Thus, these various subjects relative to removal of the resist are significant at the time of performing removal of the resist in the production of an ink jet recording head.

SUMMARY OF THE INVENTION

The principal object of the present invention is to overcome the foregoing various technical problems and to provide a resist removing process and an apparatus therefor which enable one to effectively remove resist for a short time, thereby providing a resist-free surface with an excellent cleanliness.

Another object of the present invention is to overcome various problems relative to removal of the resist which are liable to occur particularly along with microminiaturization of the pattern in recent years and to provide a resist removing process and an apparatus therefor which enable one to obtain a pattern with a high precision in size and shape.

A further object of the present invention is to provide a resist removing process and an apparatus therefor in which the consumption of a removing liquid is relatively small and no negative influence is afforded to other constituent members.

The present inventor conducted researches and studies in order to attain the above=objects. As a result, it was found that the foregoing spraying method, the foregoing dipping method, and the method comprising one of these methods and the foregoing treatment for promoting the removal resist are merely of mutual reaction based on mutual contact between the resist and the removing liquid In any case, and it is difficult to satisfactorily solve the the foregoing technical problems by any of these technical means; this situation is further apparent in the case of removing the resist in order to produce an ink jet recording head; the higher density at which numerous discharging outlets are arranged, the higher precision is required as for the size and shape of each of the minute ink pathways in communication with the discharging outlets, but such requirement of the higher precision cannot be satisfactorily attained mainly due to the foregoing problems relative to removal of the resist; and because of this, a deterioration is liable to occur for the discharging characteristics of ink from the discharging outlets as a whole. It is considered that the foregoing problems relative to removal of the resist at the fine pathways occur not only in the developing step wherein the photosensitive resin layer is developed to pattern said layer but also in the removing step wherein the patterned photosensitive layer is removed from the ink pathways.

The present inventor made further extensive studies based on the above findings, and as a result, obtained a determined that the resist removing efficiency with the use of the removing liquid can be markedly enhanced while raising the uniformity of removal of the resist by the removing liquid to an extremely high level when a gas-liquid mixture composed of the removing liquid and a gas is jetted to the resist or the removing liquid and said gas is alternately jetted to the resist.

The present inventor performed removal of the resist on the basis of the knowledge thus obtained. As a result, removal of the resist could be effectively accomplished within a short period of time, wherein the cleanliness of the face resulted after the resist having been removed therefrom was superior to that of the face obtained in the prior art. And a pattern ,with a markedly high precision in size and shape could be formed.

The present inventor then applied the foregoing knowledge in the production of an ink jet recording head. As a result, an ink jet recording head provided with ink pathways of a markedly high precision in size and shape could be obtained. The present inventor set the ink jet recording head thus obtained to an apparatus main body and recording was performed by discharging ink therefrom. As a result, it was found that the ink jet recording head obtained in the above excels in ink discharging characteristics as a whole.

The present invention has been accomplished as a result of further studies based on the findings thus obtained.

An embodiment of the process for removing a resist according to the present :invention is characterized in that a mixture composed of a resist removing liquid and a gas is jetted to the resist to thereby remove said resist.

Another embodiment of the process for removing a resist according to the present invention is characterized in that a resist removing liquid and a gas are alternately jetted to the resist to thereby remove said resist.

An embodiment of the apparatus for removing a resist according to the present invention is characterized by comprising a mixing means: for mixing a resist removing liquid and a gas and a means for jetting a mixture obtained by mixing said resist removing liquid and said gas by means of said mixing means to said resist.

Other embodiment of the apparatus for removing a resist according to the present invention is characterized by comprising a liquid supply means for supplying a resist removing liquid, a gas supply means for supplying a gas, a switching means for switching said liquid supply means to said gas supply means or the latter to the former to operate the corresponding means, and a means for alternately jetting said resist removing liquid and said gas switched by means of said switching means to the resist.

The present invention can be desirably employed particularly in the case of removing the resist in order to produce an ink jet recording head. The present invention is the most advantageous in the case where the ink jet recording head is of full-line type.

DETAILED EXPLANATION OF THE PREFERRED EMBODIMENTS

In the following, the preferred embodiments of the present invention with reference to FIG. 1.

Figure 1:
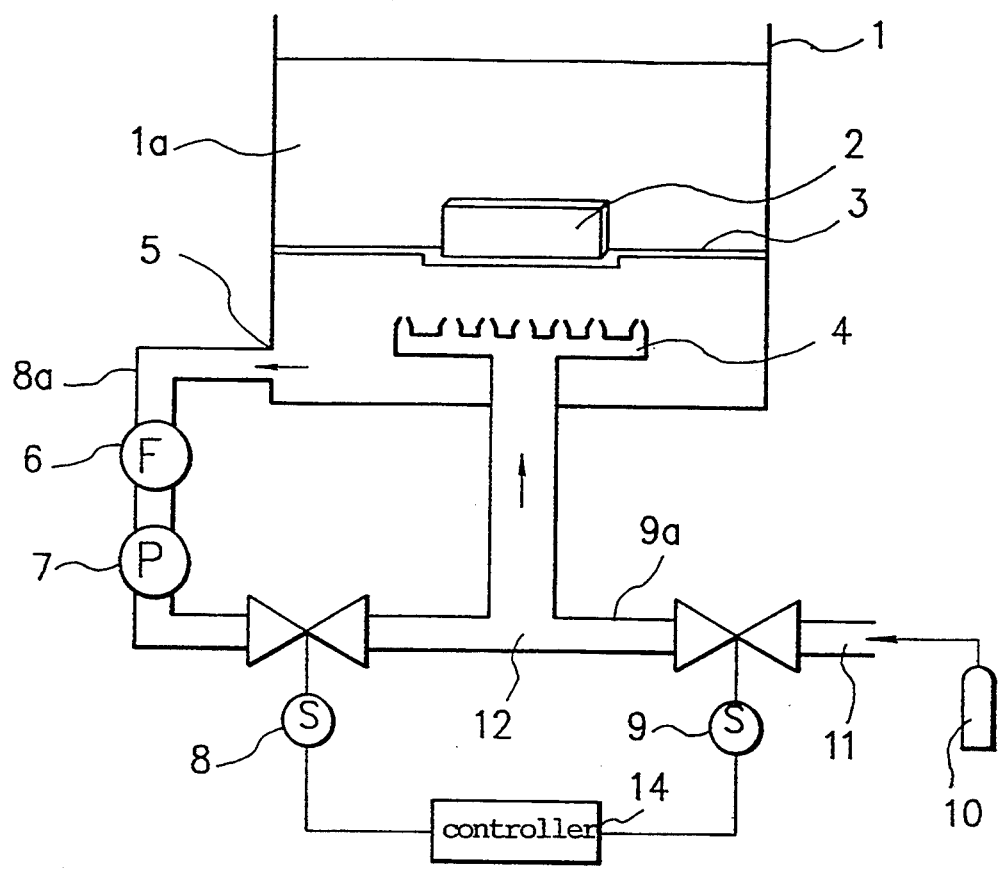
FIG. 1 is a schematic diagram of an embodiment of the resist removing apparatus according to the present invention.

FIG. 1 is a schematic diagram illustrating a resist removing apparatus as an embodiment of the present invention.

In FIG. 1, numeral reference 1 stands for a removal vessel in which a resist removing liquid 1a is stored. In the inside of the removal vessel 1, there is disposed a fixing table 3 for fixing a base member 2 from which a resist is to be removed within the removing liquid 1a. The removal vessel 1 is provided with a liquid outlet 5 through which the removing liquid 1a is circulated to recycle. A conduit 8a is connected to the liquid outlet 5, and the conduit is provided with a filter 6 serving to remove foreign matters such as dust from the removing liquid 1a, a pump 7 serving to circulate the removing liquid 1a and to jet it through a jetting nozzle 4, and a first valve 8 serving to maintain or disconnect the connection of the conduit 8a.

A conduit 9a is connected to a gas reservoir 10 through a gas inlet 11, and the conduit 9a is provided with a second valve 9 serving to continue or disconnect the connection thereof. Numeral reference 14 stands for a control system serving to control the opening and closing of each of the first valve 8 and the second valve 9.

In the following, explanation will be made of an embodiment of the resist removing process according to the present invention in which removal of the resist is performed using the above resist removing apparatus.

A base member 2 from which the resist is to be removed is first fixed onto the fixing table 3 and thereafter, a removing liquid 1a is introduced into the removal vessel 1 until at least the base member 2 is immersed in the removing liquid. The first valve 8 is opened by means of the control system 14 and the pump 7 is actuated to thereby pressure circulate the removing liquid through the liquid outlet 5 and the conduit 8a. At the same time, the second valve 9 is also opened by means of the control system 14 to introduce gas from the gas reservoir 10 into the removal vessel 1 through the conduit 9a. The removing liquid and the gas are mixed near the encountered portion 12 of the two conduits, and they are jetted in the form of a gas-liquid mixture to the resist through the jetting nozzle 4.

In this embodiment, removal of the resist is ensured to be reliably performed in the developing step or the successive removing step, wherein the consumption of the removing liquid is small, the resist is neither swelled nor dissolved, insufficient development and insufficient removal are prevented from occurring at the fine portions of the pattern, and the resulting face after the resist has been removed therefrom is of a high cleanliness.

Explanation will be made of another embodiment of the resist removing process according to the present invention.

In this embodiment, the same procedures as in the above embodiment are employed until the step of introducing the removing liquid 1a into the removal vessel 1. Then, the pump 7 is actuated and the first valve 8 is kept open for a prescribed period of time by means of the control system 14, during which the removing liquid is pressure circulated through the liquid outlet 5 and the conduit 8a to jet the removing liquid through the jetting nozzle 4. After the prescribed period of time lapses, the first valve 8 is closed and the second valve 9 is opened by means of the control system 14 to introduce the gas from the gas reservoir 10 into the removal vessel 1 through the conduit 9a. After a prescribed period of time lapses, the second valve 9 is closed and the first valve 8 is opened by means of the control system 14 to pressure circulate the removing liquid and to jet the removing liquid through the jetting nozzle 4. In this way, the removing liquid and the gas are alternately jetted to the resist through jetting nozzle 4 by alternately switching the first valve 8 and the second valve 9. In order to alternately jetting the removing liquid and the gas to the resist, it is desired that each of the first valve 8 and the second valve 9 comprises a solenoid valve and each of the valves is made timer controllable by means of the control system. The repetition cycle of alternately jetting the removing liquid and the gas is desired to be in the range of 0.1 to 5.0 seconds in practical view point. In this embodiment, significant advantages similar to those in the foregoing embodiment are provided.

Figure 3:
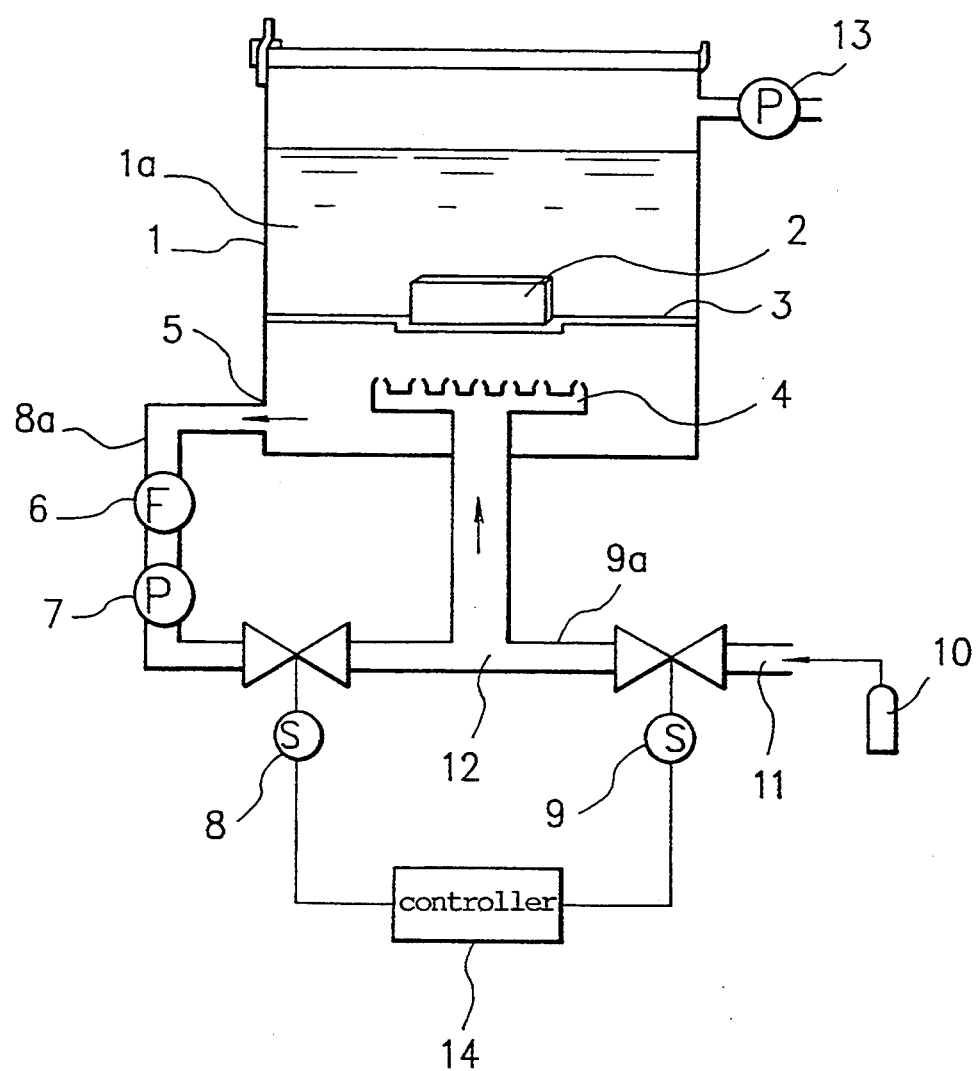
FIG. 3 is a schematic diagram of other embodiment of the resist removing apparatus according to the present invention.

A further embodiment of the present invention will be explained with reference to FIG. 3. In FIG. 3, the constituent portions which are the same as those of the resist removing apparatus of FIG. 1 are identified by the same numeral references as used in FIG. 1. In the following, explanation of these constituent portions will be omitted.

The point by which this embodiment is distinguished from the resist removing apparatus of FIG. 1 is that the removal vessel 1 is structured such that the inside thereof is substantially enclosed to form a vacuum space and that a vacuum pump 13 is connected to the vacuum space. The inside of the removal vessel 1 can be brought to reduced pressure by actuating the vacuum pump 13.

The embodiment above explained with reference to FIG. 1 is performed under atmospheric pressure, but a pronounced effect is provided when it is performed under the condition of reduced pressure. That is, the effects of the present invention are provided at higher level by jetting the removing liquid and the gas in the form of a gas-liquid mixture to the resist maintained under reduced pressure or by alternately jetting the removing liquid and the gas to the resist maintained under reduced pressure. In order to maintain the resist under reduced pressure, the base member having the resist thereon to be removed is, for example, immersed in the removing liquid and the space to which the liquid face of the removing liquid faces is evacuated to reduced pressure by means of the pump. To maintain the resist under reduced pressure means that at least the circumferential region of the resist is maintained in the state of a reduced pressure. The term reduced pressure herein means a pressure lower than the atmospheric pressure, and it includes the case of a reduced pressure substantially brought to a vacuumed state. The pressure of the space, which is in a reduced pressure state, to which the liquid face of the removing liquid faces should be properly determined depending upon related conditions such as the kind of the resist, the size of the resist, and the like, but it is desired to be 400 mmHg or less in practical view point.

The embodiment explained with reference to FIG. 1 provides further improved effects when, other than the case of performing it continuously under constant reduced pressure, it is performed while periodically changing the pressure in a reduced pressure state or while repeating the reduced pressure-state and the atmospheric pressure state alternately at an interval of a prescribed period of time. This is effective particularly in the case where the resist is of a complicated structure which is difficult to be removed, for instance, when the width of the pattern itself to be formed is small or when the space between the adjacent patterns is small.

Any of the embodiments described above is desirably applicable in the case of removing the resist in order to produce an ink jet recording head. Particularly, it is desirably applicable in the developing step shown in FIG. 4(D) wherein the photosensitive resin layer is developed and patterned and in the removing step shown in FIG. 4(F) wherein the patterned photosensitive resin layer is removed from the ink pathways. Any of the embodiments described above is most advantageously applicable in the case of producing an ink jet recording head of full-line type.

In addition, any of the embodiments above described is extremely effective when it is applied particularly in the removing step of performing removal of the resist in order to produce an ink jet recording head of the type wherein ink is discharged utilizing film boiling of ink caused by the action of thermal energy generated by the electrothermal converting body. The reason for this is considered that since not only the removing liquid but also the gas pass while being in contact with the ink pathways at the time of performing removal of the resist, a socalled aging effect is provided, for example, to the boiling face of the electrothermal converting body which causes said film boiling.

Figure 4:
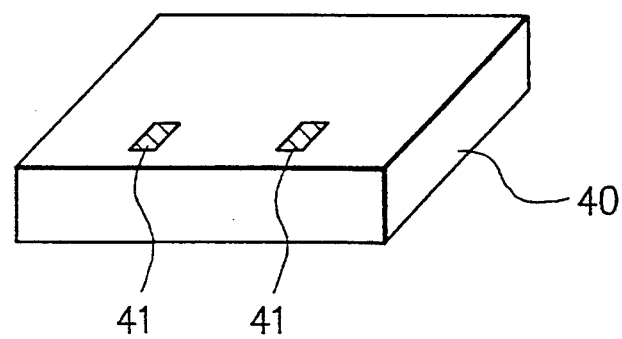
FIG. 4(A) through FIG. 4(F) are schematic slant views for explaining an application example of producing an ink jet recording head by employing the resist removing process according to the present invention.
Figure 4:
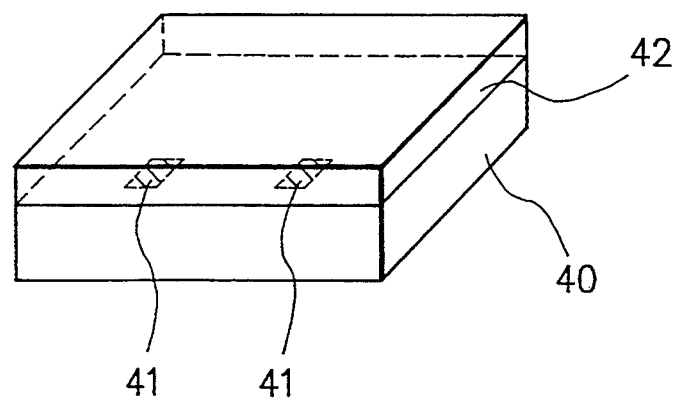

The resist to be used in any of the embodiments described alone can include photosensitive resins to be usually used in the field of photolithography. In the case of applying any of the embodiments above described in the production of an ink jet recording head, the resist is desired to be comprised of such a photosensitive resin layer of positive type as shown in FIG. 4(B). The positive type photosensitive resin is a resin material the solubility of which to solvents being increased upon irradiation of light thereto, and because of this, the removing step wherein the resist is removed by way of extracting it from the fine ink pathways as shown in FIG. 4(F) is made such that it can be more easily performed. Specific examples of such positive type photosensitive resin are materials comprising o-naphthoquinones and alkali-soluble phenol resins, materials comprising benzenediazoniums and alkali-soluble resins, and the like. Among these, a sheet made of, for example, a positive type photosensitive resin placed on a sheet comprising polyester (commercially available under the trademark of OZATEC R225, product by Hoechst Japan Kabushiki Kaisha) or the like can be mentioned as the most appropriate ones in view of ease in handling.

The removing liquid used in any of the above embodiments can include conventional removing liquids which are usually used in the field of photolithography. Specific examples of such removing liquid are aqueous solutions containing alkalies such as sodium hydroxide, potassium hydroxide, etc., aqueous solutions containing acids such as hydrochloric acid, nitric acid, etc., and organic solvents such as acetone, isopropyl alcohol, trichloroethane, etc.

The gas used in any of the above embodiments can include gases which are not reactive with any of the removing liquid and the resist, and gases which are reactive with either the removing liquid or the resist but do not substantially hinder removal of the resist. Specific examples of such gas are inert gases such as He, Ne, Ar, etc. and nitrogen gas. The effects of the present invention are provided in the case where the gas is used in a relatively small amount. However, it is practically desired for the volume ratio of the removing liquid to the gas to be in the range of 1:100 to 100:1. As for the jetting pressure at the jetting nozzle, it is desired to be in the range of 0.001 $kg/cm^2$ to 10 $kg/cm^2$.

Figure 4C:
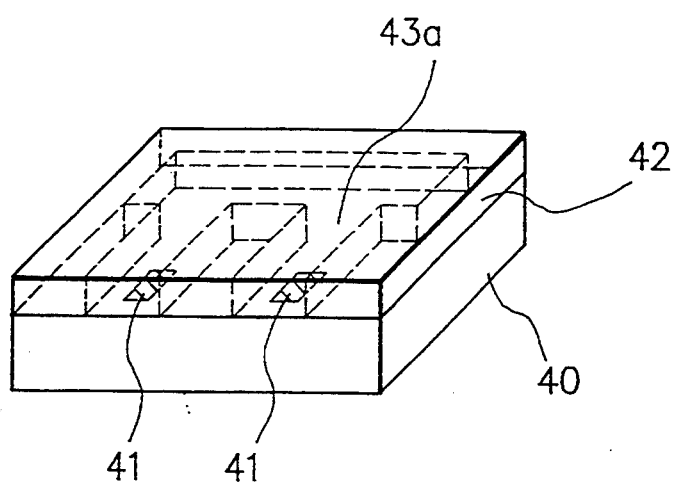
Figure 4D:
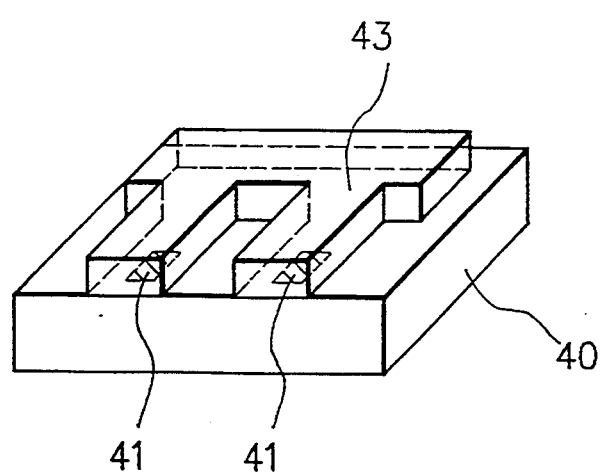
Figure 4:
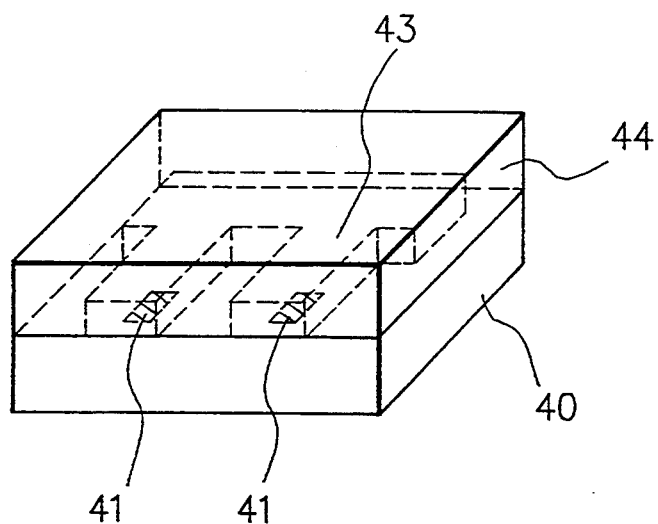
Figure 4:
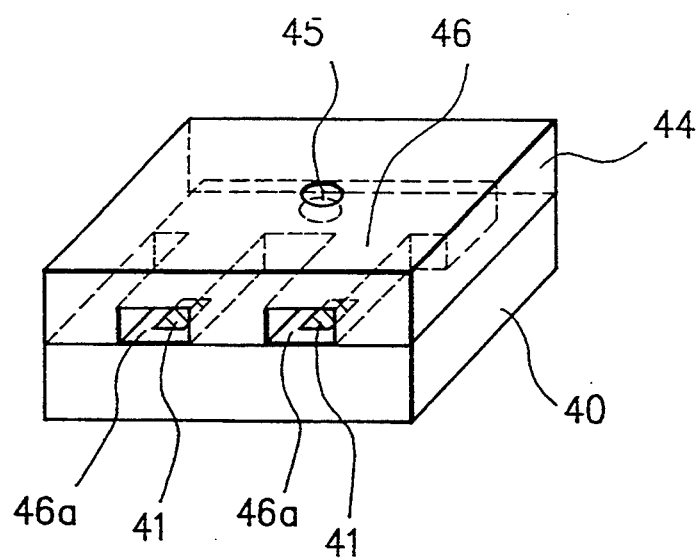

In the case of performing the developing step in order to form patterns corresponding to the fine ink pathways as shown in FIG. 4(D) or in the case of performing the removing step in order to extract the resist from the fine ink pathways thereby removing the resist as shown in FIG. 4(F) respectively by employing any of the foregoing embodiments upon producing an ink jet recording head, removal of the resist is desired to be performed under the condition that the object to be head is arranged such that jetting is conducted from the throughhole side to the discharging outlet side.

In the foregoing embodiments, the jetting nozzle in a preferred embodiment is designed for use together for both the removing liquid and the gas. However in the present invention, the jetting nozzle can be designed to have a plurality of independent nozzles, one for the removing liquid only and the other for the gas only, as long as jetting to the resist can be performed in the manner as described. Further as described, to recycle the removing liquid in order to prevent wasteful consumption of the removing liquid, but it is possible to design the pathway of the removing liquid such that the removing liquid is not recycled as well as the pathway of the gas. Further in addition, in order to control the pressure or the flow rate, the conduit for the removing liquid or the gas may be additionally provided with appropriate equipment such as valves. The foregoing encountered portion of the two conduits may comprise a simple connection of the conduits or an independent gas mixing vessel.

Explanation will be made of an example of an ink jet recording apparatus having an ink jet recording head therein which has been produced utilizing one of the foregoing embodiments, while referring to FIG. 5.

Figure 5:
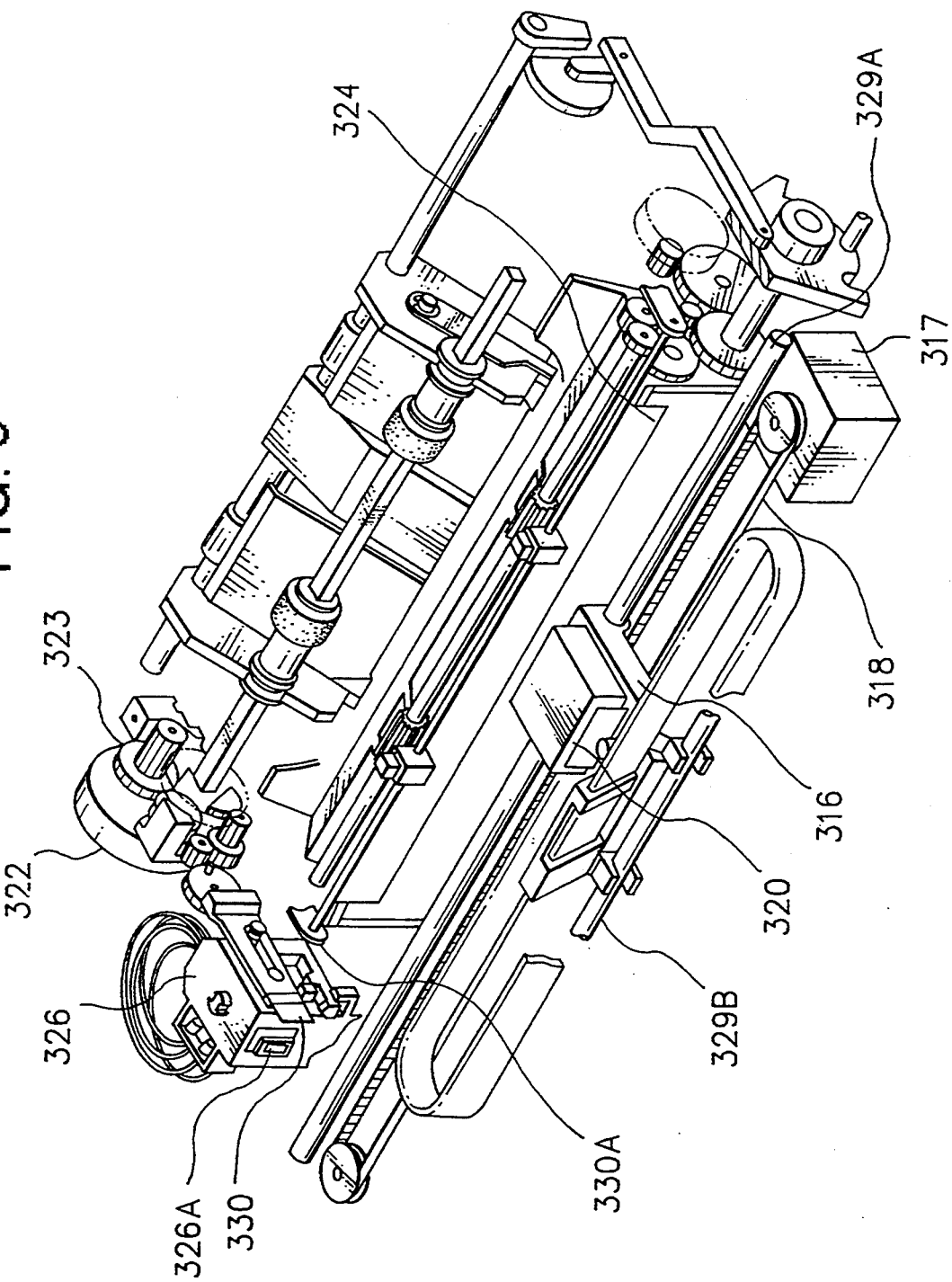
FIG. 5 is a schematic slant view illustrating the principal part of an ink jet recording apparatus.

FIG. 5 is a schematic slant view illustrating the principal part of an embodiment of the liquid jet recording apparatus.

In FIG. 5, numeral reference 320 stands for a detachable cartridge type liquid jet recording head to which a recording liquid reservoir being integrated and which is provided with a plurality of ink discharging outlets opposite the recording face of a recording sheet (not shown in the figure) transported on a platen 324. Numeral reference 316 stands for a carriage for holding the ink jet recording head 320 thereon. The carriage is connected to part of a driving belt 318 which serves to transmit a driving force from a driving motor 317, and it is designed such that it can move while sliding through a pair of guide shafts 329A and 329B being arranged in parallel with each other. By this, the ink jet recording head 320 is made capable of moving back and forth along the entire width of the recording sheet.

Numeral reference 326 stands for a recovery device which serves to recover a defect in ink discharging from the ink jet recording head 320 or to prevent occurrence of such defect, and it is disposed at a predetermined position within the range in which the ink jet recording head 320 is moved, specifically, for example, at a position opposite the home position. The recovery device 326 performs capping to the discharging outlets of the ink jet recording head 320 by a driving force through a driving mechanism 323 from a motor 322. In connection with the capping performance to the discharging outlets of the liquid jet recording head 320 by means of a cap 326A of the recovery device 326, there is performed suction of ink from the discharging outlets by means of an appropriate suction means (not shown in the figure) mounted to the recovery device 326 or force feed of ink by means of an appropriate pressure means (not shown in the figure) mounted to the ink supply path of the ink jet recording head. By this, ink is forced to expel through the discharging outlets to thereby conduct recovery treatment including removal of foreign materials such as viscid ink material present in the inside of each of the discharging outlets.

Numeral reference 330 stands for a blade made of silicone rubber capable of serving as a wiping member which is disposed at a side face of the recovery device 326. The blade 330 is held at a blade holding member 330A in the form of a cantilever boom, and it is operated, as well as in the case of the recovery device 326, by means of the motor 322 and the driving mechanism 323 so as to encounter the outlet face of each of the discharging outlets of the ink jet recording head 320. Thus, the blade 330 is projected in the range in which the ink jet recording head 320 is moved on appropriate timing during recording operation by the ink jet recording head 320 or after recovery treatment by using the recovery device 326, whereby dew drops, moisture, dusts or the like adhered on the outlet face of each of the discharging outlets of the ink jet recording head 320 can be swabbed.

In this ink jet recording apparatus, the drive of each of the recording sheet transportation means, the carriage and the recovery device, and drive of the recording head, and the like are controlled based on a demand or signal outputted from a control means containing a CPU disposed on the apparatus body side.

Figure 6:
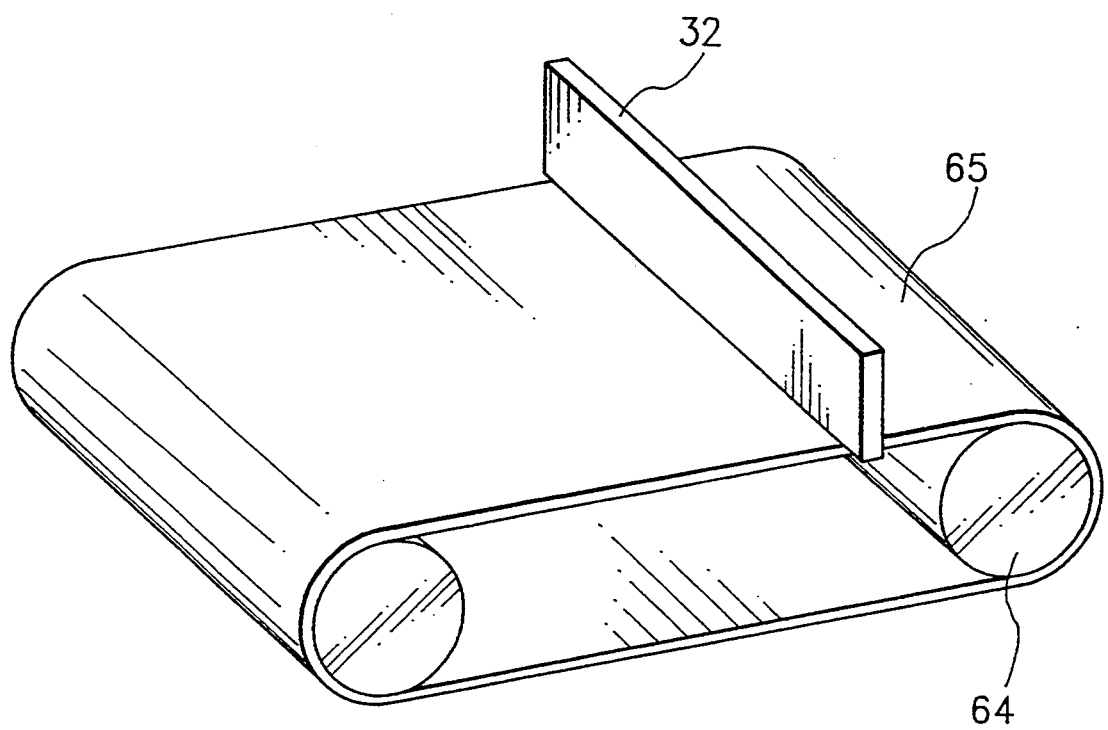
FIG. 6 is a schematic slant view illustrating the outline of an ink recording apparatus in which is a full-line type ink jet recording head is installed.

FIG. 6 is a schematic slant view illustrating a rough diagram of an ink jet recording apparatus in which a full-line type ink jet recording head 32 is installed. In this figure, numeral reference 65 stands for a transportation belt which serves to transport a member on which record is to be made such as paper. The transportation of a member on which record is to be made (not shown in the figure) by the transportation belt 65 is performed upon revolution of a transportation roller 64. The lower face of the ink jet recording head 32 is so designed as to form a discharging outlet face 31 at which a plurality of discharging outlets being arranged so as to correspond to the entire width of the recording area of the member on which record is to be made.

Example 1

Figure 2:
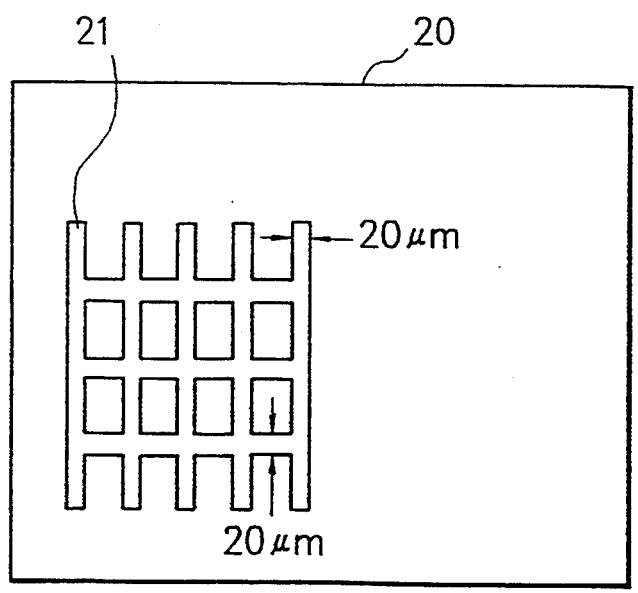
FIG. 2 is a schematic top view illustrating an example of the photomask.

A positive type photosensitive resin film (commercially available under the trademark of OZATEC R225, product by Hoechst Japan Kabushiki Kaisha) was used as the resist, and it was laminated on a glass base member at 100° C. and at a pressure of 3 kg/cm$^2$. Then, using a photomask 20 shown in FIG. 2, pattern exposure was performed to the resist at 300 mJ/cm$^2$ by means of a high pressure mercury lamp to thereby form a pattern latent image of 20 μm in line width thereon. FIG. 2 herein is a schematic top view illustrating an example of the photomask in which numeral reference 21 stands for a shielding portion to cut off light.

Then, the resist was subjected to heat treatment at 110° C. for 10 minutes.

Thereafter, the base member having the resist thereon was fixed to the fixing table 3 of the resist removing apparatus shown in FIG. 1. A 3% NaOH aqueous solution was used as the removing liquid (developing solution), and the circulating flow rate by means of the pump 7 was made to be 2 l/minute. As the gas, nitrogen gas was used. The removing liquid (developing solution) and the nitrogen gas were mixed at a volume ratio of 1:1, and the gas-liquid mixture was jetted to the resist at a jetting pressure of 1 kg/cm$^2$ to thereby perform development. Successively, the resultant was rinsed with pure water, followed by drying.

In this example, the above treatments were performed for ten samples. As for each of the samples, the situation of the resist to have been removed was examined, and the totalized result was shown in Table 1, in which the development period of time is the mean value among the ten samples. As Table 1 illustrates, it was found that to remove the resist could have been accomplished within a shortened period of time without the non-exposed portion being swelled or dissolved and without occurrence of stain in this example.

Example 2

The procedures of Example 1 were repeated, except for performing the development by alternately jetting the removing liquid (developing solution) and the nitrogen gas to the resist at an interval of 1 second and at a jetting pressure of 1 kg/cm$^2$.

In this example, the above treatments were performed also for ten samples. As for each of the samples, the situation of the resist to have been removed was examined, and the totalized result was shown in Table 1, in which the development period of time is the mean value among the ten samples. Excellent results were obtained also in this example.

Example 3

A positive type photosensitive resin (commercially available under the trademark of OFPR 800, product by Tokyo Ohkakohgyo Kabushiki Kaisha) was used as the resist, and it was applied to provide a film thickness of 1.3 μm by means of a roll coater, followed by prebaking at 90° C. for 30 minutes. Then, using the photomask 20 shown in FIG. 2, pattern exposure was performed to the resist at 5000 mJ/cm$^2$ by means of a high pressure mercury lamp to thereby form a pattern latent image of 20 μm in line width thereon.

Using a spray developing machine (product by Izumiseisakusho Kabushiki Kaisha), NMD-3(trademark name, product by Tokyo Ohkakohgyo Kabushiki Kaisha) was sprayed at a pressure of 0.2 kg/cm$^2$ to thereby perform development. Then, the resultant was rinsed with pure water, followed by drying. In order to improve the adhesion of the resist to the base member, postbaking was performed at 120° C. for 30 minutes.

Thereafter, the base member having the resist thereon was fixed to the fixing table 3 of the resist removing apparatus shown in FIG. 1. A removing liquid 1165 (trademark name, product by Shipley Company) was used as the removing liquid (removing liquid), and the circulating flow rate by means of the pump 7 was made to be 2 l/minute. As the gas, nitrogen gas was used. The removing liquid (removing liquid) and the! nitrogen gas were mixed at a volume ratio of 1:1, and the gas-liquid mixture was jetted to the resist at a jetting pressure of 1.5 kg/cm$^2$ to thereby perform removal of the resist. Successively, the resultant was rinsed with pure water, followed by drying.

In this example, the above treatments were performed for ten samples. As for each of the samples, the situation of the resist to have been removed was examined, and the totalized result was shown in Table 2, in which the removal period of time is the mean value among the ten samples. As Table 2 illustrates, it was found that to remove the resist could have been accomplished within a shortened period of time without occurrence of stain in this example.

Example 4

The procedures of Example 3 were repeated, except for performing the removal of the resist by alternately jetting the removing liquid (removing liquid) and the nitrogen gas to the resist at an interval of 1 second and at a jetting pressure of 1.5 kg/cm$^2$.

In this example, the above treatments were performed also for ten samples. As for each of the samples, the situation of the resist to have been removed was examined, and the totalized result was shown in Table 21, in which the development period of time is the mean value among the ten samples. Excellent results were obtained also in this example.

Example 5

A positive type photosensitive resin film (commercially available under the trademark of OZATEC R225, product by Hoechst Japan Kabushiki Kaisha) was used as the resist, and it was laminated on a glass base member at 100° C. and at a pressure of 3 kg/cm$^2$. Then, using the photomask 20 shown in FIG. 2, pattern exposure was performed to the resist at 300 mJ/cm$^2$ by means of a high pressure mercury lamp to thereby form a pattern latent image of 20 μm in line width thereon. Then, the resist was subjected to heat treatment at 110° C. for 10 minutes.

Thereafter, the base member having the resist thereon was fixed to the fixing table 3 of the resist removing apparatus shown in FIG. 3. A 3% NaOH aqueous solution was used as the removing liquid (developing solution), and the circulating flow rate by means of the pump 7 was made to be 2 l/minute. As the gas, nitrogen gas was used. The inside of the removal vessel 1 was brought to a reduced pressure of 10 mmHg by means of the pump 13. Under this state, the removing liquid (developing solution) and the nitrogen gas were mixed at a volume ratio of 1:1, and the gas-liquid mixture was jetted to the resist at a jetting pressure of 1 kg/cm$^2$ to thereby perform development. Successively, the resultant was rinsed with pure water, followed by drying.

In this example, the above treatments were performed for ten samples. As for each of the samples, the situation of the resist to have been removed was examined, and the totalized result was shown in Table 1, in which the development period of time is the mean value among the ten samples. As Table 1 illustrates, it was found that to remove the resist could have been accomplished within a shortened period of time without the non-exposed portion being swelled or dissolved and without occurrence of stain in this example.

Example 6

The procedures of Example 5 were repeated, except for performing the development by alternately jetting the removing liquid (developing solution) and the nitrogen gas to the resist at an interval of 1 second and at a jetting pressure of 1 kg/cm$^2$.

In this example, the above treatments were performed also for ten samples. As for each of the samples, the situation of the resist to have been removed was examined, and the totalized result was shown in Table 1, in which the development period of time is the mean value among the ten samples. Excellent results were obtained also in this example.

Example 7

A positive type photosensitive resin (commercially available under the trademark of OFPR 800, product by Tokyo Ohkakohgyo Kabushiki Kaisha) was used as the resist, and it was applied to provide a film thickness of 1.3 μm by means of a roll coater, followed by prebaking at 90° C. for 30 minutes. Then, using the photomask 20 shown in FIG. 2, pattern exposure was performed to the resist at 5000 mJ/cm$^2$ to thereby form a pattern latent image of 20 μm in line width thereon.

Using a spray developing machine (product by Izumiseisakusho Kabushiki Kaisha), NMD-3 (trademark name, product by Tokyo Ohkakohgyo Kabushiki Kaisha) was sprayed at a pressure of 0.2 kg/cm to thereby perform development. Then, the resultant was rinsed with pure water, followed by drying. In order to improve the adhesion of the resist to the base member, postbaking was performed at 120° C. for 30 minutes.

Thereafter, the base member having the resist thereon was fixed to the fixing table 3 of the resist removing apparatus shown in FIG. 3. A removing liquid 1165 (trademark name,.product by Shipley Company) was used as the removing liquid (removing liquid), and the circulating flow rate by means of the pump 7 was made to be 2 l/minute. As the gas, nitrogen gas was used. The inside of the removal vessel 1 was brought to a reduced pressure of 10 mmHg by means of the pump 13. Under this state, the removing liquid (removing liquid) and the nitrogen gas were mixed at a volume ratio of 1:1, and the gas-liquid mixture was jetted to the resist at a jetting pressure of 1.5 kg/cm$^2$ to thereby perform removal of the resist. Successively, the resultant was rinsed with pure water, followed by drying.

In this example, the above treatments were performed for ten samples. As for each of the samples, the situation of the resist to have been removed was examined, and the totalized result was shown in Table 2, in which the removal period of time is the mean value among the ten samples. As Table 2 illustrates, it was found that to remove the resist could have been accomplished within a shortened period of time without occurrence of stain in this example.

Example 8

The procedures of Example 7 were repeated, except for performing the removal of the resist by alternately jetting the removing liquid (removing liquid) and the nitrogen gas to the resist at an interval of 1 second and at a jetting pressure of 1.5 kg/cm$^2$.

In this example, the above treatments were performed also for ten samples. As for each of the samples, the situation of the resist to have been removed was examined, and the totalized result was shown in Table 2, in which the removing period of time is the mean value among the ten samples. Excellent results were obtained also in this example.

Example 9

The procedures of Example 5 were repeated, except for continuously changing the inner pressure of the removal vessel 1 in the developing step between 10 mmHg and 50 mmHg at a periodical cycle of one minute.

In this example, the above treatments were performed also for ten samples. As for each of the samples, the situation of the resist to have been removed was examined. As a result, excellent results were obtained also in this example.

Example 10

The procedures of Example 7 were repeated, except for continuously changing the inner pressure of the removal vessel 1 in the removing step between 10 mmHg and 50 mmHg at a periodical cycle of one minute.

In this example, the above treatments were performed also for ten samples. As for each of the samples, the situation of the resist to have been removed was examined. As a result, excellent results were obtained also in this example.

Comparative Example 1

The procedures of Example 1 were repeated, except that the gas was not used and only the removing liquid (developing solution) was jetted to the resist at a jetting pressure of 1 kg/cm$^2$ to thereby perform development.

In this example, the above treatments were performed also for ten samples. As for each of the samples, the situation of the resist to have been removed was examined, and the totalized result was shown in Table 1, in which the development period of time is the mean value among the ten samples.

Comparative Example 2

The procedures of Example 1 were repeated, except that using a spray developing machine (product by Izumiseisakusho Kabushiki Kaisha), the removing liquid (developing solution) was sprayed to the resist at a jetting pressure of 1 kg/cm$^2$ to thereby perform development.

In this example, the above treatments were performed also for ten samples. As for each of the samples, the situation of the resist to have been removed was examined, and the totalized result was shown in Table 1, in which the development period of time is the mean value among the ten samples.

Comparative Example 3

The procedures of Example 3 were repeated, except that the gas was not used and only the removing liquid (removing liquid) was jetted to the resist at a jetting pressure of 1.5 kg/cm$^2$ to thereby perform the removal of the resist.

In this example, the above treatments were performed also for ten samples. As for each of the samples, the situation of the resist to have been removed was examined, and the totalized result was shown in Table 2, in which the removing period of time is the mean value among the ten samples.

Comparative Example 4

The procedures of Example 3 were repeated, except that using a spray developing machine (product by Izumiseisakusho Kabushiki Kaisha), the removing liquid (removing liquid) was sprayed to the resist at a jetting pressure of 1.5 kg/cm$^2$ to thereby perform the removal of the resist.

In this example, the above treatments were performed also for ten samples. As for each of the samples, the situation of the resist to have been removed was examined, and the totalized result was shown in Table 2, in which the removing period of time is the mean value among the ten samples.

TABLE 1

|  | developing period of time*1 | swelling or/and dissolution of the non-exposed portion | stain |
| --- | --- | --- | --- |
| Example 1 | 1 minute | not observed | not observed |
| Example 2 | 50 seconds | not observed | not observed |
| Example 5 | 45 seconds | not observed | not observed |
| Example 6 | 40 seconds | not observed | not observed |
| Comparative Example 1 | 1 mins. and 20 secs. | much observed in the edge portion | partly observed |
| Comparative Example 2 | 1 mins. and 50 secs. | not observed | partly observed |

*1 the period of time until the exposed resist disappeared.

TABLE 2

|  | removing period of time *2 | stain |
| --- | --- | --- |
| Example 3 | 6 minutes | not observed |
| Example 4 | 6 minutes | not observed |
| Example 7 | 5 minutes | not observed |
| Example 8 | 5 minutes | not observed |
| Comparative Example 3 | 6 mins. and 50 secs. | partly observed |
| Comparative Example 4 | 7 mins. and 40 secs. | entirely observed |

*2 the period of time until the pattern (non-exposed portion) after the development disappeared.

Application Example 1

Following the production procedures schematically shown in FIG. 4(A) through FIG. 4(F), the resist removing process of the present invention was performed to produce an ink jet recording head.

First, as shown in FIG. 4(A), there was provided a glass base member 40 having a electrothermal converting body formed thereon, which is capable of serving as the energy generating body 41 to generate energy to be utilized for discharging ink. Then, as shown in FIG. 4(B), on the glass base member 40 was laminated a 50 μm thick photosensitive resin layer 42 comprising a positive type photosensitive resin film (commercially available under the trademark of OZATEC R225, product by Hoechst Japan Kabushiki Kaisha) as the resist at 100° C. and at a pressure of 3 kg/cm$^2$.

A photomask (not shown in the figure) was superposed on the photosensitive resin layer 42, followed by irradiation of ultraviolet rays to other than the portions at which ink pathways are to be formed at 70 mJ/cm$^2$ to thereby form a latent image 43a indicated by dotted line in FIG. 4(C) at the photosensitive resin layer 42. Then the base member 40 was fixed to the fixing table 3 of the resist removing apparatus of FIG. 1 in a state that the discharging outlet side is positioned with the face upward while slanting a bit so that the gas-liquid mixture jetted from the jetting nozzle 4 is allowed to smoothly flow from the throughhole side to the discharging outlet side. A 1% NaOH aqueous solution was used as the removing liquid (developing solution), and the circulating flow rate by means of the pump 7 was made to be 2 l/minute. As the gas, nitrogen gas was used. The removing liquid (developing solution) and the nitrogen gas were mixed at a volume ratio of 1:1, and the gas-liquid mixture was jetted to the photosensitive resin layer 42 at a jetting pressure of 1 kg/cm$^2$ to thereby perform development as shown in FIG. 4(D). Successively, the resultant was rinsed with pure water, followed by dryings.

Then, as shown in FIG. 4(E), ARALDITE CY230-/HY956 (trademark name, product by Ciba Geigy Company) as the pathway wall-forming material 44 for forming an ink pathway wall was applied at a thickness of 100 μm by means of an applicator so as to cover the photosensitive resin layer 43 patterned through the development. After the resultant having been allowed to stand at 30° C. for 12 hours to make the pathway wall-forming material 44 cured, ultraviolet rays were irradiated from the opposite sides of the base member at 3000 mJ/cm$^2$ to solubilize the patterned photosensitive resin layer 43.

Thereafter, the throughhole 45 was formed by means of a cutting technique, and the base member 40 was fixed to the fixing table 3 of the resist removing apparatus of FIG. 1 such that the discharging outlet side is positioned with the face upward while slanting a bit so that the gas-liquid mixture jetted from the jetting nozzle 4 is allowed to smoothly flow from the throughhole side to the discharging outlet side. A 5% NaOH aqueous solution was used as the removing liquid (removing liquid), and the circulating flow rate by means of the pump 7 was made to be 2/minute. As the gas, nitrogen gas was used. The removing liquid (removing liquid) and the nitrogen gas were mixed at a volume ratio of 1:1, and the gas-liquid mixture was jetted to the patterned photosensitive resin layer 43 at a jetting pressure of 1.5 kg/cm$^2$ to thereby perform removal thereof. Successively, the resultant was rinsed with pure water, followed by drying. Thus, there was obtained an ink jet recording head schematically shown in FIG. 4(F). This ink jet recording head was found to have 128 discharging outlets 46a respectively of a rectangular shape of 50 μm×60 μm although only two discharging outlets being shown in the figure, ink pathways 46 in communication with the spouting outlets, and electrothermal converting bodies in the number corresponding thereto.

This ink jet recording head was found not to have any residue of the photosensitive resin layer in the ink pathways, and it was found to excel in precision of the shape and that of the size of each ink pathway. The ink jet recording head thus obtained was set to the ink jet recording apparatus shown in FIG. 5 to discharge ink, and as a result, stable recording could be continuously performed over a long period of time, wherein excellent discharging characteristics as a whole were provided.

Application Example 2

The procedures of Application Example 1 were repeated until the step of FIG. 4(C).

Then, the base member 40 was fixed to the fixing table 3 of the resist removing apparatus of FIG. 1 in a state that the discharging outlet side is positioned with the face upward while slanting a bit so that the removing liquid and the gas jetted from the jetting nozzle 4 are allowed to smoothly flow from the throughhole side to the discharging outlet side. A 1% NaOH aqueous solution was used as the removing liquid (developing solution), and the circulating flow rate by means of the pump 7 was made to be 2 l/minute. As the gas, nitrogen gas was used. The removing liquid (developing solution) and the nitrogen gas were alternately jetted to the photosensitive resin layer 42 at an interval of 1 second and at a jetting pressure of 1 kg/cm$^2$ to thereby perform development as shown in FIG. 4(D). Successively, the resultant was rinsed with pure water, followed by drying.

Then, as shown in FIG. 4(E), ARALDITE CY230-/HY956 (trademark name, product by Ciba Geigy Company) as the pathway wall-forming material 44 for forming an ink pathway wall was applied at a thickness of 100 μm by means of an applicator so as to cover the photosensitive resin layer 43 patterned through the development. After the resultant having been allowed to stand at 30° C. for 12 hours to make the pathway wall-forming material 44 cured, ultraviolet rays were irradiated from the opposite sides of the base member at 3000 mJ/cm$^2$ to solubilize the patterned photosensitive resin layer 43.

Thereafter, the throughhole 45 was formed by means of a cutting technique, and the base member 40 was fixed to the fixing table 3 of the resist removing apparatus of FIG. 1 such that the discharging outlet side is positioned with the face upward while slanting a bit so that the removing liquid and the gas jetted from the jetting nozzle 4 are allowed to smoothly flow from the throughhole side to the discharging outlet side. A 5% NaOH aqueous solution was used as the removing liquid (removing liquid), and the circulating flow rate by means of the pump 7 was made to be 2 l/minute. As the gas, nitrogen gas was used. The removing liquid (removing liquid) and the nitrogen gas were alternately jetted to the patterned photosensitive resin layer 43 at an interval of 1 second and at a jetting pressure of 1.5 kg/cm$^2$ to thereby perform removal thereof. Successively, the resultant was rinsed with pure water, followed by drying. Thus, there was obtained an ink jet recording head schematically shown in FIG. 4(F). This ink jet recording head was found to have 128 discharging outlets 46a respectively of a rectangular shape of 50 μm ×60 μm although only two discharging outlets being shown in the figure, ink pathways 46 in communication with the discharging outlets, and electrothermal converting bodies in the number corresponding thereto.

This ink jet recording head was found not to have any residue of the photosensitive resin layer in the ink pathways, and it was found to excel in precision of the shape and that of the size of each ink pathway. The ink jet recording head thus obtained was set to the ink jet recording apparatus shown in FIG. 5 to discharge ink, and as a result, stable recording could be continuously performed over a long period of time, wherein excellent discharging characteristics as a whole were provided.

Application Example 3

The procedures of Application Example 1 were repeated until the step of FIG. 4(C).

Then, the base member 40 was fixed to the fixing table 3 of the resist removing apparatus of FIG. 1 in a state that the discharging outlet side is positioned with the face upward while slanting a bit so that the gas-liquid mixture jetted from the jetting nozzle 4 is allowed to smoothly flow from the throughhole side to the discharging outlet side. A 1% NaOH aqueous solution was used as the removing liquid (developing solution), and the circulating flow rate by means of the pump 7 was made to be 2 l/minute. As the gas, nitrogen gas was used. The inside of the removal vessel 1 was brought to a reduced pressure of 10 mmHg by means of the pump 13. Under this state, the removing liquid (developing solution) and the nitrogen gas were mixed at a volume ratio of 1:1, and the gas-liquid mixture was jetted to the photosensitive resin layer 42 at a jetting pressure of 1 kg/cm$^2$ to thereby perform development as shown in FIG. 4(D). Successively, the resultant was rinsed with pure water, followed by drying.

Then, as shown in FIG. 4(E), ARALDITE CY230-/HY956 (trademark name, product by Ciba Geigy Company) as the pathway wall-forming material 44 for forming an ink pathway wall was applied at a thickness of 100 μm by means of an applicator so as to cower the photosensitive resin layer 43 patterned through the development. After the resultant having been allowed to stand at 30° C. for 12 hours to make the pathway wall-forming material 44 cured, ultraviolet rays were irradiated from the opposite sides of the base member at 3000 mJ/cm$^2$ to solubilize the patterned photosensitive resin layer 43.

Thereafter, the throughhole 45 was formed by means of a cutting technique, and the base member 40 was fixed to the fixing table 3 of the resist removing apparatus of FIG. 1 such that the discharging outlet side is positioned with the face upward while slanting a bit so that the gas-liquid mixture jetted from the jetting nozzle 4 is allowed to smoothly flow from the throughhole side to the discharging outlet side. A 5% NaOH aqueous solution was used as the removing liquid (removing liquid), and the circulating flow rate by means of the pump 7 was made to be 2 l/minute. As the gas, nitrogen gas was used. The inside of the removal vessel 1 was brought to a reduced pressure of 10 mmHg. Under this state, the removing liquid (removing liquid) and the nitrogen gas were mixed at a volume ratio of 1:1, and the gas-liquid mixture was jetted to the patterned photosensitive resin layer 43 at a jetting pressure of 1.5 kg/cm$^2$ to thereby perform removal thereof. Successively, the resultant was rinsed with pure water, followed by drying. Thus, there was obtained an ink jet recording head schematically shown in FIG. 4(F). This ink jet recording head was found to have 128 discharging outlets 46a respectively of a rectangular shape of 50 μm ×60 μm, although only two discharging outlets being shown in the figure, ink pathways 46 in communication with the discharging outlets, and electrothermal converting bodies in the number corresponding thereto.

This ink jet recording head was found not to have any residue of the photosensitive resin layer in the ink pathways, and it was found to excel in precision of the shape and that of the size of each ink pathway. The ink jet recording head thus obtained was set to the ink jet recording apparatus shown in FIG. 5 to discharge ink, and as a result, stable recording could be continuously performed over a long period of time, wherein excellent discharging characteristics as a whole were provided.

Application Example 4

The procedures of Application Example 1 were repeated until the step of FIG. 4(C).

Then, the base member 40 was fixed to the fixing table 3 of the resist removing apparatus of FIG. 1 in a state that the discharging outlet side is positioned with the face upward while slanting a bit so that the removing liquid and the gas jetted from the jetting nozzle 4 are allowed to smoothly flow from the throughhole side to the discharging outlet side. A 1% NaOH aqueous solution was used as the removing liquid (developing solution), and the circulating flow rate by means of the pump 7 was made to be 2 l/minute. As the gas, nitrogen gas was used. The inside of the removal vessel 1 was brought to a reduced pressure of 10 mmHg by means of the pump 13. Under this state, the removing liquid (developing solution) and the nitrogen gas were alternately jetted to the photosensitive resin layer 42 at an interval of 1 second and at a jetting pressure of 1 kg/cm$^2$ to thereby perform development as shown in FIG. 4(D). Successively, the resultant was rinsed with pure water, followed by drying.

Then, as shown in FIG. 4(E), ARALDITE CY230-/HY956 (trademark name, product by Ciba Geigy Company) as the pathway wall-forming material 44 for forming an ink pathway wall was applied at a thickness of 100 μm by means of an applicator so as to cover the photosensitive resin layer 43 patterned through the development. After the resultant having been allowed to stand at 30° C. for 12 hours to make the pathway wall-forming material 44 cured, ultraviolet rays were irradiated from the opposite sides of the base member at 3000 mJ/cm$^2$ to solubilize the patterned photosensitive resin layer 43.

Thereafter, the throughhole 45 was formed by means of a cutting technique, and the base member 40 was fixed to the fixing table 3 of the resist removing apparatus of FIG. 1 such that the discharging outlet side is positioned with the face upward while slanting a bit so that the removing liquid and the gas jetted from the jetting nozzle 4 are allowed to smoothly flow from the throughhole side to the discharging outlet side. A 5% NaOH aqueous solution was used as the removing liquid (removing liquid), and the circulating flow rate by means of the pump 7 was made to be 2l/minute. As the gas, nitrogen gas was used. The inside of the removal vessel 1 was brought to a reduced pressure of 10 mmHg by means of the pump 13. Under this state, the removing liquid (removing liquid) and the nitrogen gas were alternately jetted to the patterned photosensitive resin layer 43 at an interval of 1 second and at a jetting pressure of 1.5 kg/cm$^2$ to thereby perform removal thereof. Successively, the resultant was rinsed with pure water, followed by drying. Thus there was obtained an ink jet recording head schematically shown in FIG. 4(F). This ink jet recording head was found to have 128 discharging outlets 46a respectively of a rectangular shape of 50 μm ×60 μm although only two discharging outlets being shown in the figure, ink pathways 46 in communication with the discharging outlets, and electrothermal converting bodies in the number corresponding thereto.

This ink jet recording head was found not to have any residue of the photosensitive resin layer in the ink pathways, and it was found to excel in precision of the shape and that of the size of each ink pathway. The ink jet recording head thus obtained was set to the ink jet recording apparatus shown in FIG. 5 to discharge ink, and as a result, stable recording could be continuously performed over a long period of time, wherein excellent discharging characteristics as a whole were provided.

Application Example 5

The procedures of Application Example 3 were repeated, except for continuously changing the inner pressure of the removal vessel 1 in the developing step between 10 mmHg and 50 mmHg at a periodical cycle of one minute.

The resultant ink jet recording head was found not to have any residue of the photosensitive resin layer in the ink pathways, and it was found to excel in precision of the shape and that of the size of each ink pathway. The resultant ink jet recording head was set to the ink jet recording apparatus shown in FIG. 5 to discharge ink, and as a result, stable recording could be continuously performed over a long period of time, wherein excellent discharging characteristics as a whole were provided.

Application Example 6

The procedures of Application Example 4 were repeated, except for continuously changing the inner pressure of the removal vessel 1 in the removing step between 10 mmHg and 50 mmHg at a periodical cycle of one minute.

The resultant ink jet recording head was found not to have any residue of the photosensitive resin layer in the ink pathways, and it was found to excel in precision of the shape and that of the size of each ink pathway. The resultant ink jet recording head was set to the ink jet recording apparatus shown in FIG. 5 to discharge ink, and as a result, stable recording could be continuously performed over a long period of time, wherein excellent discharging characteristics as a whole were provided.

BRIEF EXPLANATION OF THE DRAWINGS

I claim:

1. A process for removing a resist in the formation of an ink pathway pattern for an ink jet recording head by disposing a resist on a base member, comprising jetting a removing liquid and gas to said base member having said resist thereon while mixing said resist removing liquid and gas and while immersing said base member having said resist thereon in said resist removing liquid, thereby removing said resist from said base member to thereby form an ink jet recording head by the removal of the resist.

2. A process for removing resist according to claim 1, wherein removing the resist is preformed under a reduced pressure lower than the atmospheric pressure.

3. A process for removing resist according to claim 2, wherein the state reduced pressure is ranging from pressure substantially brought to a vacuum state to a pressure 400 mmHg.

4. A process for removing a resist according to claim 2, wherein the the reduced pressure is varied at intervals of a prescribed period of time.

5. A process for removing a resist according to claim 1, wherein the resist removing liquid and the gas are mixed at a volume ratio of 1:100 to 100:1.

6. A process for removing resist according to claim 1, wherein the jetting to the resist is performed at a pressure of 0.01 kg/cm$^2$ to 10 kg/cm$^2$.

7. A process for removing resist according to claim 1, wherein the gas is an inert gas.

8. A process for removing resist according to claim 7, wherein the inert gas is at least one selected from He, Ne and Ar.

9. A process for removing resist according to claim 1, wherein the gas is nitrogen gas.

10. A process for removing a resist according to claim 1, wherein the resist to be removed is a portion corresponding to an ink pathway of the ink jet recording head.

11. A process for removing resist according to claim 10, wherein the resist to be removed is a positive type photosensitive resin.

12. A process for removing a resist according to claim 10, further comprising jetting said removing liquid and gas in a direction from a throughhole side to a discharging outlet side of the ink jet recording head.

13. A process for removing a resist according to claim 1, further comprising providing the ink pathway pattern to be formed with a material serving as an electrothermal converting body for generating a thermal energy utilized for discharging ink.

14. A process for removing a resist, in the formation of an ink pathway pattern for an ink jet recording head by disposing resist on a base member comprising: alternately jetting a removing liquid and a gas to said base member having said resist thereon while immersing said base member in said resist removing liquid, thereby removing said resist from said base member to thereby form an ink jet recording head by the removal of the resist.

15. A process for removing a resist according to claim 14, further comprising removing said resist under a reduced pressure lower than the atmospheric pressure.

16. A process for removing resist according to claim 15, wherein the reduced pressure is ranging from pressure substantially brought to a vacuum state to pressure of 400 mmHg.

17. A process for removing a resist according to claim 15, wherein the reduced pressure is varied at intervals of a prescribed period of time.

18. A process for removing a resist according to claim 14, further comprising mixing the resist removing liquid and the gas mixed at a volume ratio of 1:100 to 100:1.

19. A process for removing resist according to claim 14, further comprising alternately jetting the resist moving liquid and the gas at a pressure of 0.01 kg/cm$^2$ to 10 kg/cm$^2$.

20. A process for removing resist according to claim 14, wherein the gas is an inert gas.

21. A process for removing resist according to claim 20, wherein the inert gas is at least one selected from He, Ne and Ar.

22. A process for removing resist according to claim 14, wherein the gas is nitrogen gas.

23. A process for removing a resist according to claim 14, wherein the resist to be removed is a portion corresponding to an ink pathway of the ink jet recording head.

24. A process for removing resist according to claim 23, wherein the resist to be removed is a positive type photosensitive resin.

25. A process for removing a resist according to claim 23, further comprising jetting said removing liquid gas in a direction from throughhole side toward a discharging outlet side of the ink jet recording head.

26. A process for removing resist according to claim 14, wherein the periodical cycle for the resist removing liquid and the gas to be alternately jetted is in the range of 0.1 second to 5 seconds.

27. A process for removing a resist according to claim 14, further comprising providing the ink pathway pattern to be formed with a material serving as an electrothermal converting body for generating thermal energy utilized for discharging ink.

* * * * *

UNITED STATES PATENT AND TRADEMARK OFFICE
CERTIFICATE OF CORRECTION

PATENT NO. : 5,443,942
DATED : August 22, 1995
INVENTOR(S) : ISAO IMAMURA

It is certified that error appears in the above-indentified patent and that said Letters Patent is hereby corrected as shown below:

COLUMN 1

Line 45, "usually," should read --usually, the--.
Line 49, "portion" should read --portions--.

COLUMN 2

Line 67, "thousands" should read --thousands of--.

COLUMN 3

Line 30, "above=objects" should read --above objects--.
Line 36, "liquid" should read --liquid.-- and "and" should be deleted.
Line 57, "obtained a" should be deleted.

COLUMN 4

Line 3, "pattern ," should read --pattern--.
Line 19, ":invention" should read --invention--.
Line 29, "means:" should read --means--.

COLUMN 5

Line 3, "the" (second occurrence) should read --are the--.

COLUMN 6

Line 68, "pressure-state" should read --pressure state--.

UNITED STATES PATENT AND TRADEMARK OFFICE
CERTIFICATE OF CORRECTION

PATENT NO. : 5,443,942
DATED : August 22, 1995
INVENTOR(S) : ISAO IMAMURA

It is certified that error appears in the above-indentified patent and that said Letters Patent is hereby corrected as shown below:

COLUMN 7

Line 28, "socalled" should read --so-called--.
Line 32, "alone" should read --above--.

COLUMN 8

Line 26, "described." (first occurrence) should read --described above.-- and "described," (second occurrence) should read --described, it is desired--.

COLUMN 10

Line 62, "(removing liquid)" should be deleted.
Line 65, "(removing liquid)" should be deleted and "the!" should read --the--.

COLUMN 11

Line 16, "(removing liquid)" should be deleted.
Line 23, "21," should read --2,--.

COLUMN 12

Line 24, "0.2 kg/cm" should read --0.2 kg/cm$^2$--.
Line 33, "name,. product" should read --name, product--.
Line 39, "(removing" should be deleted.
Line 40, "liquid)" should be deleted.
Line 58, "(removing liquid)" should be deleted.

COLUMN 13

Line 66, "(removing liquid)" should be deleted.

UNITED STATES PATENT AND TRADEMARK OFFICE
CERTIFICATE OF CORRECTION

PATENT NO.  : 5,443,942
DATED       : August 22, 1995
INVENTOR(S) : ISAO IMAMURA It is certified that error appears in the above-indentified patent and that said Letters Patent is hereby corrected as shown below:

COLUMN 14

Line 12, "(removing liquid)" should be deleted.

COLUMN 15

Line 16, "ings." should read --ing.--.
    Line 37, "(removing" should be deleted.
    Line 38, "liquid)," should be deleted.
    Line 39, "2/minute." should read --2 1/minute--.
    Line 40, "(removing liquid)" should be deleted.

COLUMN 16

Line 37, "(removing liquid)," should be deleted.
    Line 39, "(re-" should be deleted.
    Line 40, "moving liquid)" should be deleted.

COLUMN 17

Line 21, "cower" should read --cover--.
    Line 36, "(removing" should be deleted.
    Line 37, "liquid)," should be deleted.
    Line 42, "(removing liquid)" should be deleted.

COLUMN 18

Line 41, "(removing liquid)" should be deleted.
    Line 42, ""21/minute." should read --2 1/minute.--.
    Line 46, "(removing liquid)" should be deleted.

UNITED STATES PATENT AND TRADEMARK OFFICE
CERTIFICATE OF CORRECTION

PATENT NO. : 5,443,942
DATED : August 22, 1995
INVENTOR(S) : ISAO IMAMURA

It is certified that error appears in the above-indentified patent and that said Letters Patent is hereby corrected as shown below:

COLUMN 19

Line 33 should be deleted.
    Line 47, "removing" should read --removing a--.

COLUMN 20

Line 27, "removing" should read --removing a--.
    Line 29, "to" should read --to a--.
    Line 38, "removing" should read --removing a--.

Signed and Sealed this

Fifth Day of March, 1996

Attest:

BRUCE LEHMAN

*Attesting Officer*     *Commissioner of Patents and Trademarks*